(12) United States Patent
Kumazaki

(10) Patent No.: US 8,700,380 B2
(45) Date of Patent: Apr. 15, 2014

(54) METHOD FOR GENERATING PERFORMANCE EVALUATION MODEL

(75) Inventor: Yoichiro Kumazaki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 819 days.

(21) Appl. No.: 12/289,759

(22) Filed: Nov. 3, 2008

(65) Prior Publication Data

US 2009/0150137 A1    Jun. 11, 2009

(30) Foreign Application Priority Data

Dec. 10, 2007   (JP) ................... 2007-318093

(51) Int. Cl.
*G06F 9/455*        (2006.01)
(52) U.S. Cl.
USPC .......................................................... 703/23
(58) Field of Classification Search
USPC .......................................................... 703/23
See application file for complete search history.

(56) References Cited

U.S. PATENT DOCUMENTS

| 5,953,519 | A  | * | 9/1999 | Fura ............................... 716/104 |
| 6,169,968 | B1 | * | 1/2001 | Kabuo ............................ 703/14 |
| 2002/0073375 | A1 | * | 6/2002 | Hollander ...................... 714/739 |
| 2002/0138686 | A1 | * | 9/2002 | Yang et al. ..................... 711/105 |
| 2006/0052995 | A1 |   | 3/2006 | Odagawa et al. |

FOREIGN PATENT DOCUMENTS

JP        2006-079369        3/2006

* cited by examiner

*Primary Examiner* — David Silver
(74) *Attorney, Agent, or Firm* — Staas & Halsey LLP

(57) ABSTRACT

A method for generating performance evaluation model may be provided which executes, by using first models of function modules which are described in a transaction level, a first simulation of system operation at the transaction level between the function modules, records transactions which are generated in the first simulation per function module, executes, by using second models of the function modules which are described in a hardware level, a second simulation of circuit operation of each of the function modules to determine a delay time of each function module of the recorded transactions, and assigns information of the delay time to the first model and generating a third model per function module.

20 Claims, 14 Drawing Sheets

METHOD FOR GENERATING PERFORMANCE EVALUATION MODEL

CROSS-REFERENCE TO RELATED APPLICATIONS

This application is related to and claims priority to Japanese Patent Application No. 2007-318093 filed on Dec. 10, 2007, and incorporated by reference herein.

BACKGROUND

1. Field

The embodiments discussed herein are directed to computer aided design.

2. Description of the Related Art

In development of a system LSI on which various function modules, including a CPU, a memory, etc., are mounted, it takes time to perform a simulation for verifying operations of the entire system because the LSI has a large circuit scale. In order to evaluate a processing capability of the entire LSI system, hardware and software should be operated at the same time in a verification process. The related art is disclosed in Japanese Laid-open Patent Publication No. 2006-79369.

SUMMARY

It is an aspect of the embodiments discussed herein to provide a method for generating performance evaluation model may be provided which executes, by using first models of function modules which are described in a transaction level, a first simulation of system operation at the transaction level between the function modules, records transactions which are generated in the first simulation per function module, executes, by using second models of the function modules which are described in a hardware level, a second simulation of circuit operation of each of the function modules to determine a delay time of each function module of the recorded transactions, and assigns information of the delay time to the first model and generating a third model per function module.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE EMBODIMENTS

Figure 1:
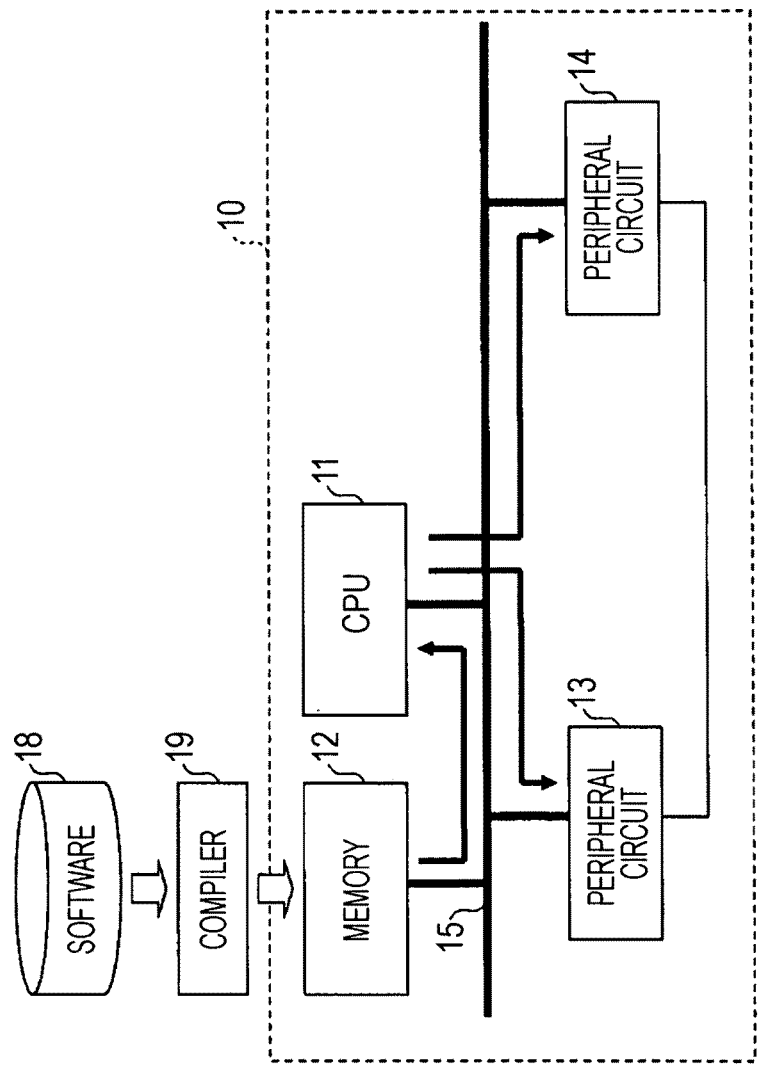
FIG. 1 illustrates a system LSI.

FIG. 1 illustrates a system LSI. An LSI 10 may include a CPU 11, a memory 12, a first peripheral circuit 13, a second peripheral circuit 14, and a bus 15. The CPU 11, the memory 12, the first peripheral circuit 13, and the second peripheral circuit 14 may be interconnected with each other via the bus 15 so as to communicate bi-directionally.

Software 18 may be converted by a compiler 19 to an executable format file, i.e., a command sequence of machine language, and is then loaded into the memory 12 of the LSI 10. The CPU 11 reads and executes each command in the executable format file, whereby transactions are executed, as required, among the memory 12, the first peripheral circuit 13 and the second peripheral circuit 14 via the bus 15. As a result, operations of the entire system are progressed.

When developing a system, the circuit configuration of each function module (i.e., the CPU 11, the memory 12, the first peripheral circuit 13, or the second peripheral circuit 14) of the LSI 10 at a hardware level may be described in RTL (Register Transfer Level), and the operation of each function module may be verified. Because the operation of each function module described in RTL is prescribed in units of clock, performance evaluation of each function module may be performed in units of clock. A very large amount of computations is required to verify the entire system using the RTL description.

For the purpose of verifying the operation of the entire system, PV (Programmer's View) is also used which performs design and verification in units of execution command of application software based on the viewpoint of a programmer. In the PV, a modeling CPU executes the commands of the application software to execute transactions among the various function modules via a bus such that an entire system is operated at a transaction level. Behaviors of each function module are prescribed in the form of data input and data output. When a data input representing a transaction is applied, a corresponding predetermined process may be executed and a data output representing a transaction may be provided as a processing result. The PV model can speed up verification simulation because each function module is simplified corresponding to a unit at which the CPU executes the program command.

The PV employs a model simplified in units of program command execution by the CPU, and it cannot measure the processing capability of the system in units of clock. To accurately estimate the processing capability of the system, a time taken by processing of each function module in the simulation has to be accurately obtained.

Figure 2:
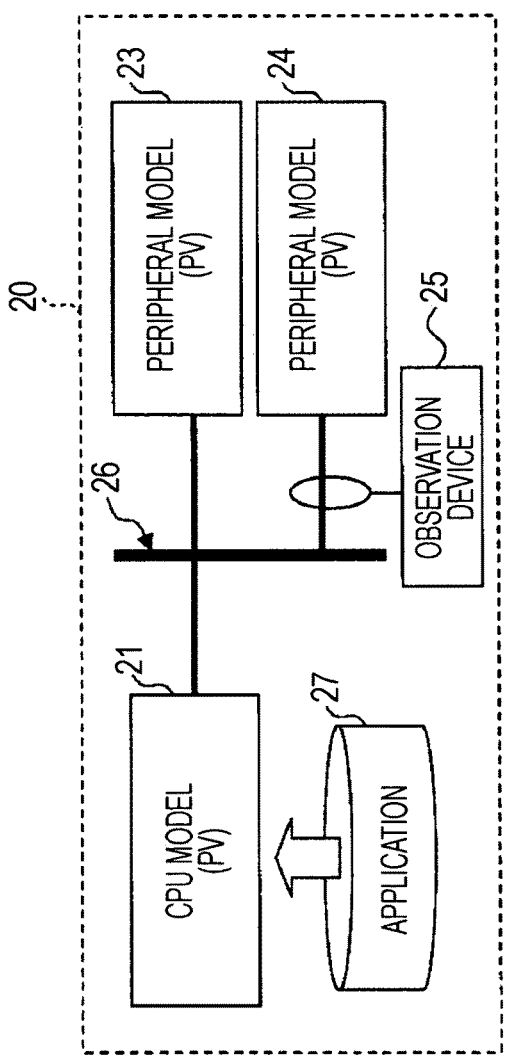
FIG. 2 illustrates an exemplary embodiment.

FIG. 2 illustrates an exemplary embodiment. An LSI model 20 is a model obtained by representing the LSI 10, shown in FIG. 1, based on software. The LSI model 20 includes a CPU model 21, a peripheral model 23, a peripheral model 24, an observation device 25, and a bus 26. The CPU model 21, the peripheral model 23, and the peripheral model 24 are models obtained by representing respectively the CPU 11, the first peripheral circuit 13, and the second peripheral circuit 14, shown in FIG. 1, based on the PV. While a memory model is omitted in FIG. 2, a model representing the memory 12, shown in FIG. 1, may also be included as a peripheral model in FIG. 2.

In the embodiment, a simulation of the operation of the system (LSI 10) may be executed at a transaction level among the function modules by using first models (i.e., the CPU model 21, the peripheral model 23, and the peripheral model 24) which are obtained by describing the function modules (i.e., the CPU 11, the first peripheral circuit 13, and the second peripheral circuit 14) at a transaction level. When the CPU model 21 executes each program command of an application 27, transactions are generated among the function modules corresponding to the execution of each program command, whereby operations of the entire system are progressed. The observation device 25 records the transactions generated in the simulation per function module. In the embodiment, the peripheral model 24 is selected as an observation target, and transactions of the peripheral model 24 as the observation target are recorded by the observation device 25. The observation device 25 may be coupled to a junction at which the peripheral model 24 may be coupled to the bus 26, thus recording history of the transactions input to the peripheral model 24.

Figure 3:
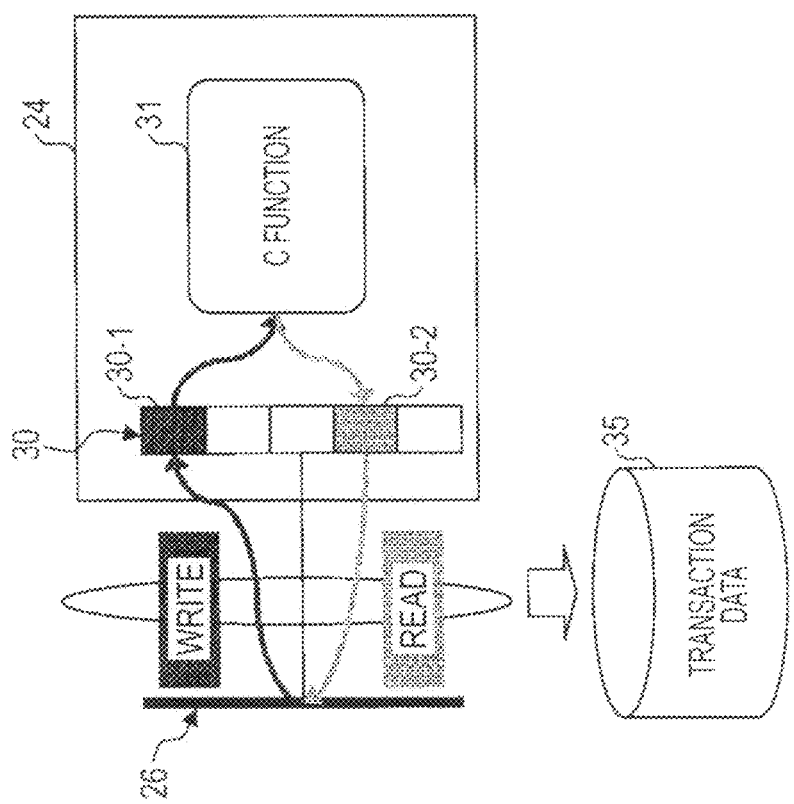
FIG. 3 illustrates a transaction recording operation according to an exemplary embodiment.

FIG. 3 illustrates a transaction recording operation in an embodiment. The peripheral model 24 includes an interface register (I/F register) 30 having a plurality of registers, and a C function 31 for defining behaviors of the peripheral model 24. The C function 31 is not required to be a function described using the C language, and it may be a function described using a language that is capable of properly defining behaviors of a peripheral circuit. The interface register 30 is a register group including a plurality of registers which are provided for data input/output between the bus 26 and the peripheral model 24. Each register is assigned with a specific address for access via the bus 26.

In FIG. 3, when an operation of writing predetermined data in a register 30-1 of the interface register 30 via the bus 26 (a write operation) may be executed, a processing operation prescribed by the C function 31 is started. When the processing operation prescribed by the C function 31 is completed, data corresponding to the processing result (data of the processing result or data indicating the completion of the processing) is loaded in a register 30-2 of the interface register 30. Then, the contents of the register 30-2 are read out to the bus 26 with a data read operation (a read operation), whereby the CPU model 21, for example, obtains the processing result of the peripheral model 24. The data write operation and the data read operation are transactions performed via the bus 26, and history of the transactions is recorded as transaction data 35. While the CPU model 21 mainly generates transactions, another peripheral model 23 may also serve as a bus master to generate transactions.

A simulation of the system operation may be executed by the LSI model 20, shown in FIG. 2, executing the application 27. The transactions generated in the simulation are recorded by the observation device per function module. By preparing the observation device for each function module, the transactions of all the function modules are recorded in one simulation.

Figure 4:
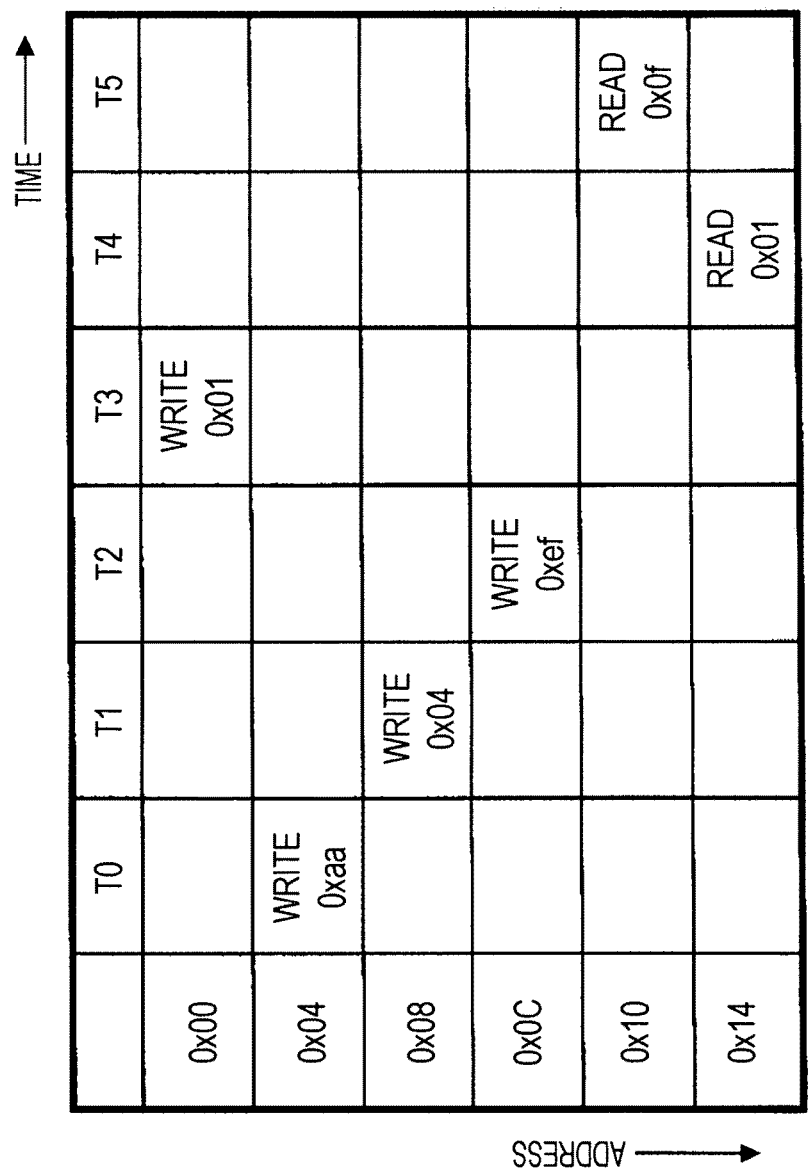
FIG. 4 illustrates exemplary transaction data.

FIG. 4 illustrates exemplary transaction data. The transaction data may be provided by recording the write data or the read data per operation cycle T0, T1, T2, etc. to the respective registers of the interface register 30 to which addresses 0x00, 0x04, 0x08, etc. are assigned. In FIG. 4, data 0xaa is written in the register of the address 0x04 in the cycle T0. Data 0x04 is written in the register of the address 0x08 in the cycle T1. Data 0x01 is read from the register of the address 0x14 in the cycle T4.

In FIG. 4, the addresses are shown up to 0x14. Assuming, for example, that the peripheral model 24 includes the registers having addresses up to 0x32, the transaction data of the peripheral model 24 has each row corresponding to each of the addresses from 0x00 to 0x32. Thus, the transactions may be recorded per interface register of each function module. In FIG. 4, the cycles are shown as ending at T5. For example, when the simulation is further executed after T5, corresponding cycles are continued. The term "operation cycle" may be defined as a cycle corresponding to a command executed by the CPU model 21 in a one-to-one relation. The term "operation cycle" also may be defined as a cycle corresponding to each transaction in a one-to-one relation.

Figure 5:
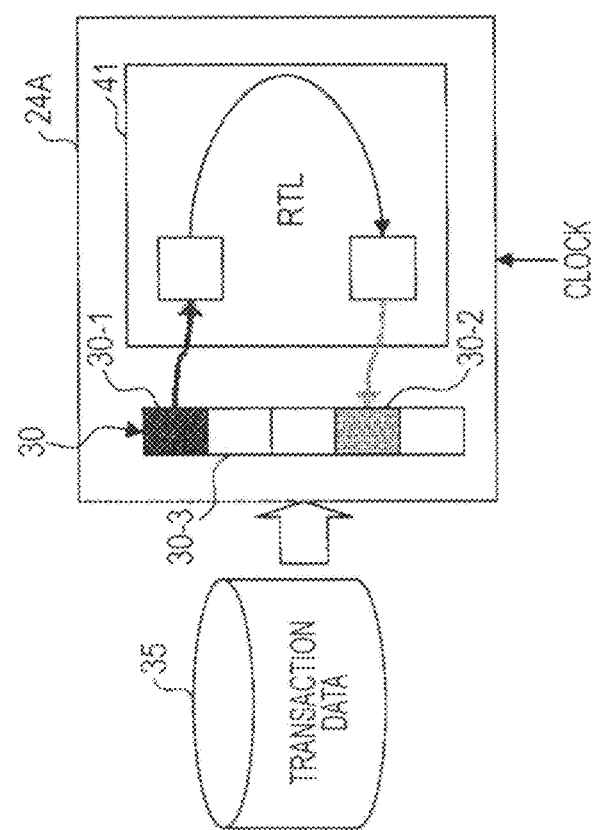
FIG. 5 illustrates a performance evaluation model producing method according to an exemplary embodiment.

FIG. 5 illustrates a performance evaluation model producing method according to an exemplary embodiment. After the transaction data 35 shown in FIG. 3 has been recorded, a simulation of the processing operation corresponding to the transaction data 35 may be executed based on the RTL description.

A peripheral model 24A, shown in FIG. 5, is a model obtained by representing the second peripheral circuit 14, shown in FIG. 1, based on an RTL description 41, and it prescribes circuit operation at a data transfer level between the registers. A clock signal is input to the peripheral model 24A and, in sync with each pulse of the clock signal, data is successively transferred from one flip-flop to another flip-flop within the circuit. A data write into the register 30-1 of the interface register 30 and a data read from the register 30-2 thereof in the peripheral model 24 are recorded as the transaction data 35. Based on the transaction data 35, in the peripheral model 24A, in response to the data write into the register 30-1 of the interface register 30, a simulation of the processing operation corresponding to the data write may be executed in accordance with the RTL description 41. When the processing operation is completed, data corresponding to the processing result (i.e., data of the processing result or data indicating the completion of the processing) is loaded in the register 30-2 of the interface register 30. A time required to execute the processing, i.e., a time elapsed from the data write into the register 30-1 of the interface register 30 to the loading of the processing result into the register 30-2 of the interface register 30, may be provided as a transaction delay time caused by the peripheral model 24A. The delay time may be expressed by the number of cycles of clocks that are used to operate the model in the RTL description.

A second simulation of the circuit operation of the function module (peripheral circuit 14) may be executed by using a second model (peripheral model 24A) described at a hardware level. A delay time of the function module (peripheral circuit 14) is determined with respect to the recorded transactions (i.e., the data write into the register 30-1 and the data read from the register 30-2, which are recorded as the transaction data 35). By executing the second simulation per function module, the delay time can be determined per function module. The delay time may be determined per interface register. For example, when a predetermined processing operation may be executed corresponding to the data write into a register 30-3 of the interface register 30 shown in FIG. 5, the delay time of the processing operation may be determined as the delay time of the processing corresponding to the register 30-3 separately from the delay time of the processing corresponding to the register 30-1. When a plurality of processing operations are executed on one register and they provide different delay times, the longest delay time (i.e., the delay time in the worst condition) may be determined as the delay time of the register. Further, when an interrupt is generated in response to a certain transaction for a certain function module, a time until the occurrence of the interrupt may be determined as the delay time.

Figure 6:
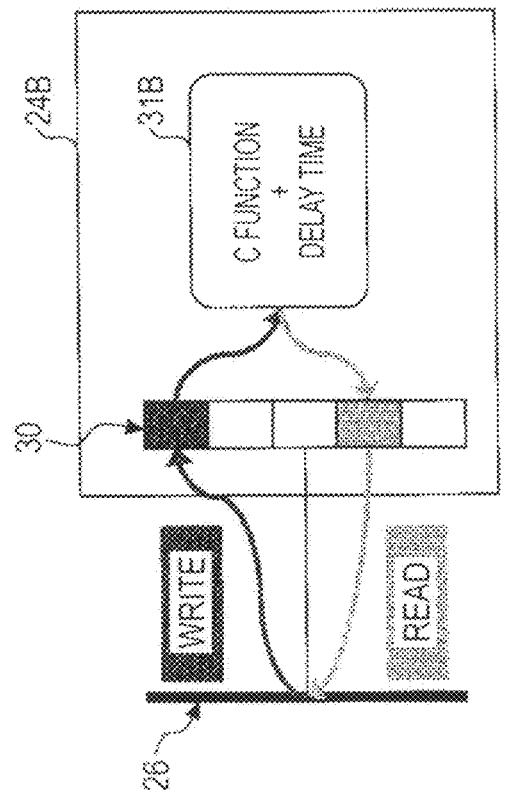
FIG. 6 illustrates the performance evaluation model producing method according to an exemplary embodiment.

FIG. 6 illustrates the performance evaluation model producing method according to an exemplary embodiment. After the delay time has been determined based on the transaction data 35 as shown in FIG. 5, a process of incorporating the determined delay time into the PV model may be executed. The same elements in FIG. 6 as in FIG. 3 are designated by the same reference numerals and their description is omitted here.

A peripheral model 24B, shown in FIG. 6, includes an interface register 30 having a plurality of registers, and a C function 31B for defining behaviors of the peripheral model 24B. The C function 31B is equivalent to the C function 31 shown in FIG. 3. However, the C function 31B, shown in FIG. 6, differs from the C function 31, shown in FIG. 3, in that information regarding the delay time is incorporated in the C function 31B. The information regarding the delay time represents the delay time of the transactions that are executed as the data write into the register 30-1 and the data read from the register 30-2, shown in FIG. 5. The delay time may be expressed by the number of cycles of clocks that are used to operate the model in the RTL description.

Thus, a third model of the function module (i.e., the peripheral model 24B) may be may be produced by assigning the information regarding the delay time to the first model of the function module (i.e., the peripheral model 24 as the PV model). By producing the third model per function module, the third model of each function module may be produced. In the third model of each function module produced as described above, a processing time required for the processing operation is prescribed in units of clock cycle.

Figure 7:
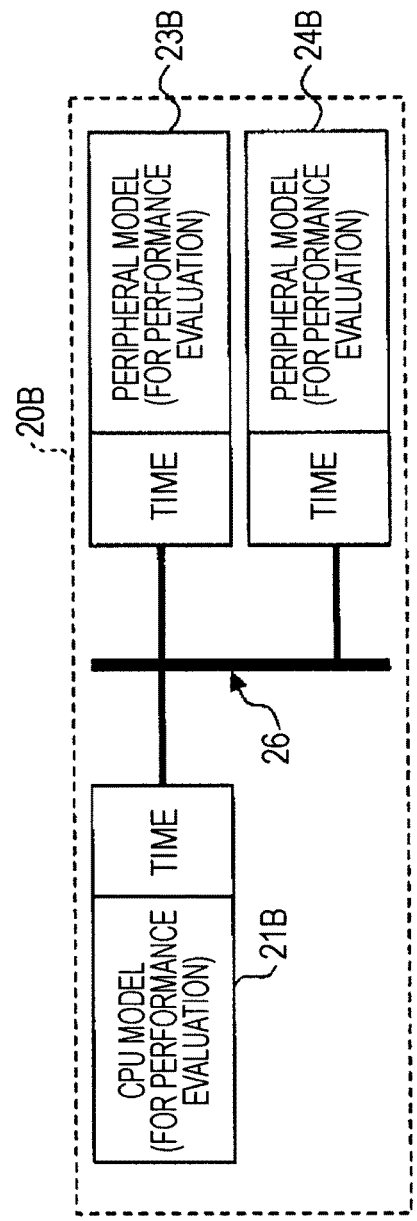
FIG. 7 illustrates a system performance evaluation method according to an exemplary embodiment.

FIG. 7 illustrates a system performance evaluation method according to an exemplary embodiment. In FIG. 7, an LSI model 20B is a model obtained by representing the LSI 10, shown in FIG. 1, based on software. The LSI model 20B includes a CPU model 21B, a peripheral model 23B, a peripheral model 24B, and a bus 26. The CPU model 21B, the peripheral model 23B, and the peripheral model 24B are models obtained by adding respectively delay time information Time to the CPU model 21, the peripheral model 23, and the peripheral model 24, shown in FIG. 2. The peripheral model 24B, shown in FIG. 7, corresponds to the peripheral model 24B shown in FIG. 6.

Each of the third models (i.e., the CPU model 21B, the peripheral model 23B, and the peripheral model 24B) of the respective function modules (i.e., the CPU 11, the first peripheral circuit 13, and the second peripheral circuit 14) has the time information Time representing the processing time for the processing operation in units of clock cycle. Accordingly, the performance of the entire system is evaluated by executing an operation simulation of the entire system at a transaction level again in consideration of the time information Time. The processing time of the system operation may be determined by executing a third simulation of the system operation at a transaction level among the function modules by using the third models.

Figure 8:
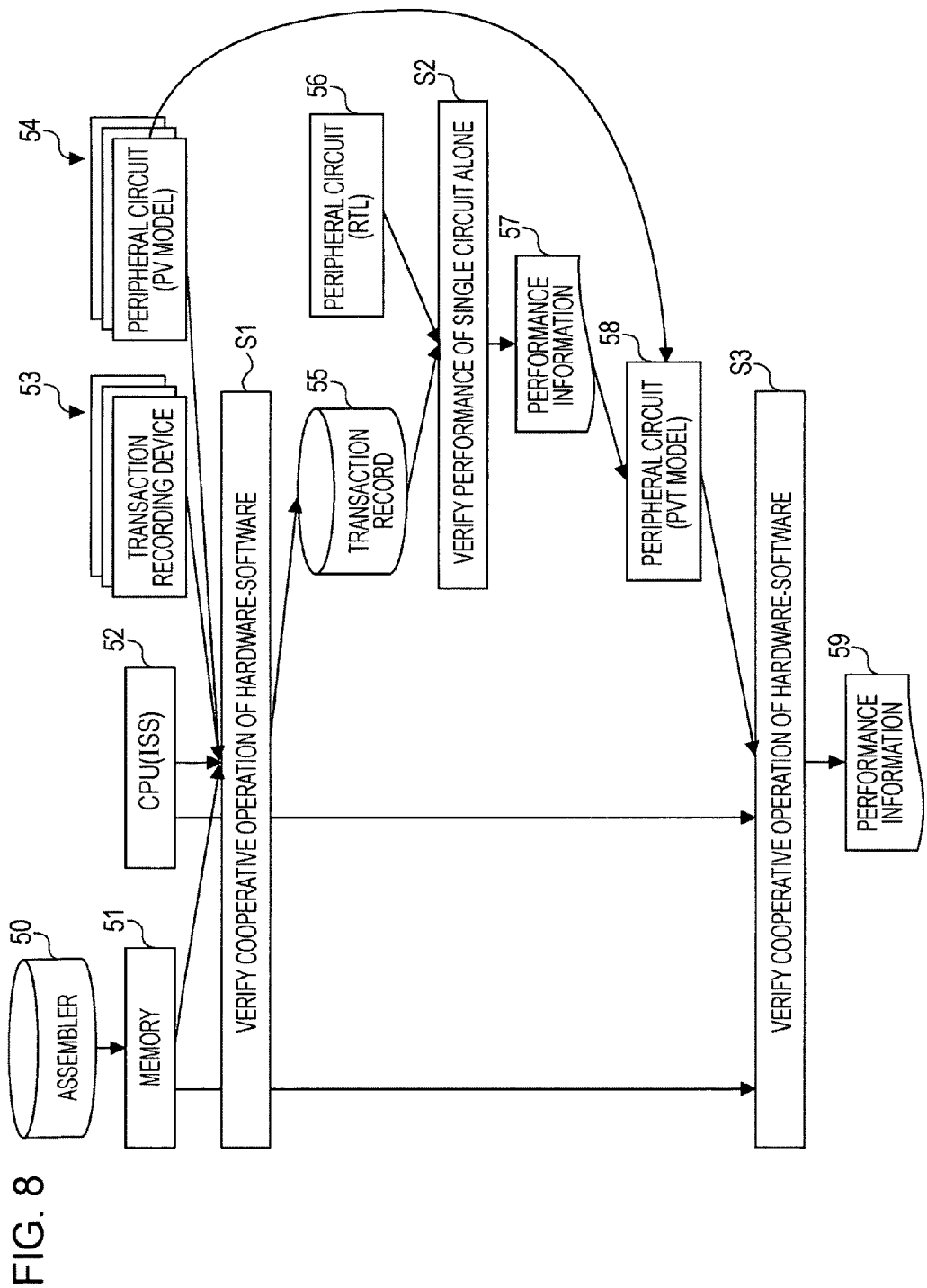
FIG. 8 illustrates the system performance evaluation method according to an exemplary embodiment.

FIG. 8 illustrates the system performance evaluation method according to an exemplary embodiment.

A program in an executable format may be produced from application software as an execution target based on an assembler 50 and is stored in a memory 51. The memory 51 may be, for example, a PV model corresponding to the memory 12 shown in FIG. 1. A CPU 52 is a CPU model including software as a command set simulator, and it executes the program in the executable format. The CPU 52 corresponds, for example, to the CPU 11 shown in FIG. 1. A peripheral circuit 54 is a PV model of a peripheral circuit and corresponds, for example, to the peripheral circuits 13 and 14 shown in FIG. 1. A transaction recording device 53 records transactions with respect to each function module and corresponds, for example, to the observation device 25 shown in FIG. 2. The transaction recording device 53 may be coupled to a junction at which the peripheral circuit may be coupled to the bus, and it records history of transactions input to the peripheral circuit.

In an operation S1, a simulation for verifying a cooperative operation of hardware and software may be executed for a system including the memory 51, the CPU 52, and the peripheral circuit 54. A simulation of the system operation at a transaction level is performed by the CPU 52 executing the application program stored in the memory 51. The transaction recording device 53 records the transactions with respect to each peripheral circuit 54, thereby producing a transaction record 55. The transaction record 55 corresponds to the transaction data 35 shown in FIG. 3.

In an operation S2, the performance of a single peripheral circuit alone may be verified based on both the transaction record 55 and a peripheral circuit 56 in the RTL description. By operating the peripheral circuit 56 in the RTL description in sync with clocks as shown in FIG. 5, a delay time of the processing operation of the transaction, which is recorded in the transaction record 55, is measured per register of the interface register. As a result of the simulation, data indicating the delay time is obtained as performance information 57. The performance information 57 represents a delay time of the processing that may be executed by each peripheral circuit in response to the transaction. In other words, the performance information 57 represents the performance of each single peripheral circuit alone.

A peripheral circuit 58 as a PVT (Programmer's View with Timing) model may be produced by incorporating the performance information 57 in the peripheral circuit 54 as a PV model. As shown in FIG. 6, information expressing a time taken from the start of execution of the C function to the end thereof in the number of clock cycles is assigned to the C function as a PV model. Thus, a processing time required to execute the C function is determined.

In an operation S3, a simulation for verifying a cooperative operation of hardware and software may be executed for a system including the memory 51, the CPU 52, and the peripheral circuit 58. A simulation of the system operation at a transaction level is performed by the CPU 52 executing the application program stored in the memory 51. The PVT model of each function module has the time information representing the processing time in units of clock cycle. Accordingly, the performance of the entire system is evaluated by executing an operation simulation of the entire system at a transaction level again in consideration of the time information Time. Performance (evaluation) information 59 obtained represents, for example, a time required to execute a predetermined system operation.

Figure 9:
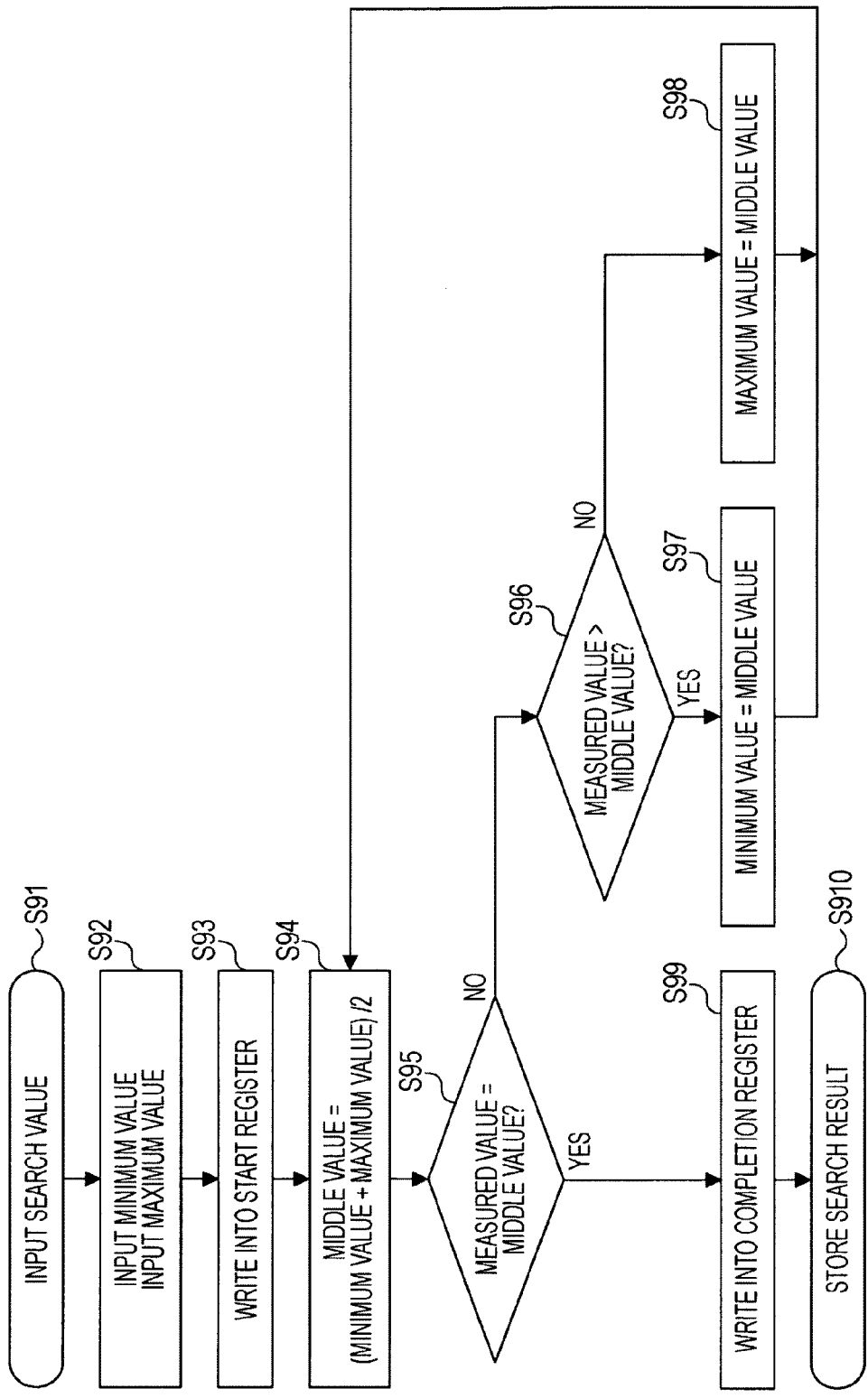
FIG. 9 illustrates an exemplary algorithm for a binary search.
Figure 10:
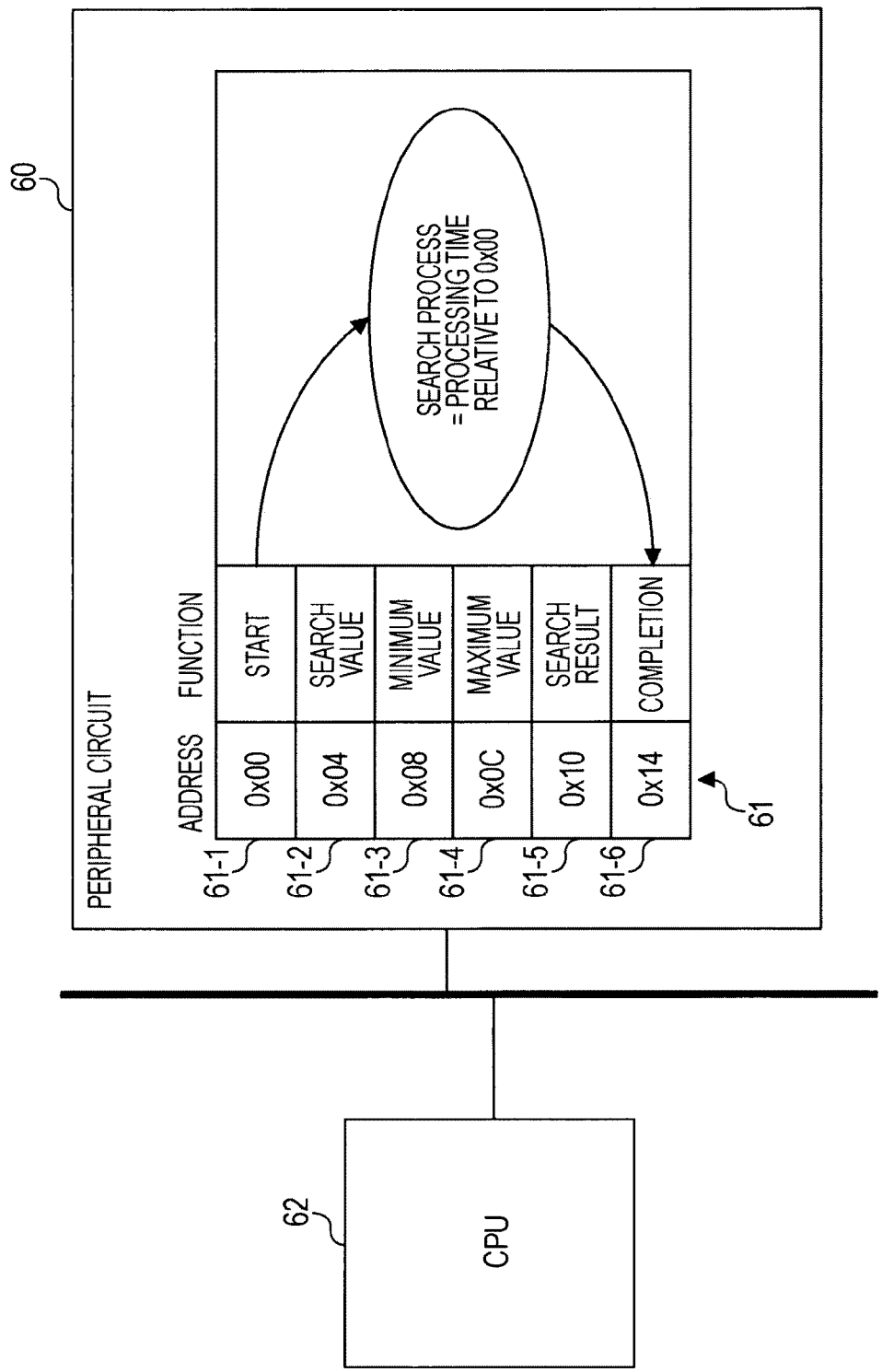
FIG. 10 illustrates an exemplary peripheral circuit for executing the binary search.

FIG. 9 illustrates an algorithm for a binary search. FIG. 10 illustrates a peripheral circuit for executing the binary search.

In an operation S91 of FIG. 9, a search value is input. The operation S91 corresponds to a process in which a CPU 62 writes the value of a search target in a register 61-2 of an interface register 61 in a peripheral circuit 60 shown in FIG. 10. The register 61-2 has an address of 0x04 and is assigned with a search value loading function.

In an operation S92, a minimum value and a maximum value are input. The operation S2 corresponds to a process in which the CPU 62 writes the minimum value and the maximum value in registers 61-3 and 61-4 of the interface register 61, respectively, in the peripheral circuit 60 shown in FIG. 10. The register 61-3 has an address of 0x08 and is assigned with a minimum value loading function. The register 61-4 has an address of 0x0C and is assigned with a maximum value loading function.

In an operation S93, a write operation to a start register may be executed. The operation S93 corresponds to a process in which the CPU 62 writes a value instructing start of a binary search process in a register 61-1 of the interface register 61 in the peripheral circuit 60 shown in FIG. 10. The register 61-1 has an address of 0x00 and is assigned with a binary search start instruction. When a value instructing the start of the binary search process is written into the register 61-1, the peripheral circuit 60 starts the binary search process.

In an operation S94, the binary search process executed by the peripheral circuit 60, shown in FIG. 10, calculates a middle value by dividing the sum of the minimum value and the maximum value by two (2). In an operation S95, the binary search process executed by the peripheral circuit 60, shown in FIG. 10, determines whether a measured value (search value) and the middle value are equal to each other. If the search value and the middle value differ from each other, the binary search process advances to an operation S96.

In the operation S96, the binary search process executed by the peripheral circuit 60, shown in FIG. 10, determines whether the measured value (search value) is larger than the middle value. If the measured value (search value) is larger than the middle value, the minimum value is set to the middle value in an operation S97, and the process returns to the operation S94. If the measured value (search value) is not larger than the middle value, the maximum value is set to the middle value in an operation S98, and the process returns to the operation S94.

If it is determined in the operation S95 that the measured value (search value) is equal to the middle value, the process advances to an operation S99. In the operation S99, a value indicating the completion of the binary search process is loaded in a completion register. The operation S99 corresponds to that, in the binary search process executed by the peripheral circuit 60 shown in FIG. 10, a value indicating the completion of the process is written in a register 61-6 of the interface register 61. The register 61-6 has an address of 0x14 and a function corresponding to the register 61-6 is a binary search completion notification.

In an operation S910, the search result is stored. The operation S910 corresponds to that, in the binary search process executed by the peripheral circuit 60 shown in FIG. 10, a value indicating the search result is written in a register 61-5 of the interface register 61. The register 61-5 has an address of 0x10 and is assigned with a binary search result loading function.

Figure 11:
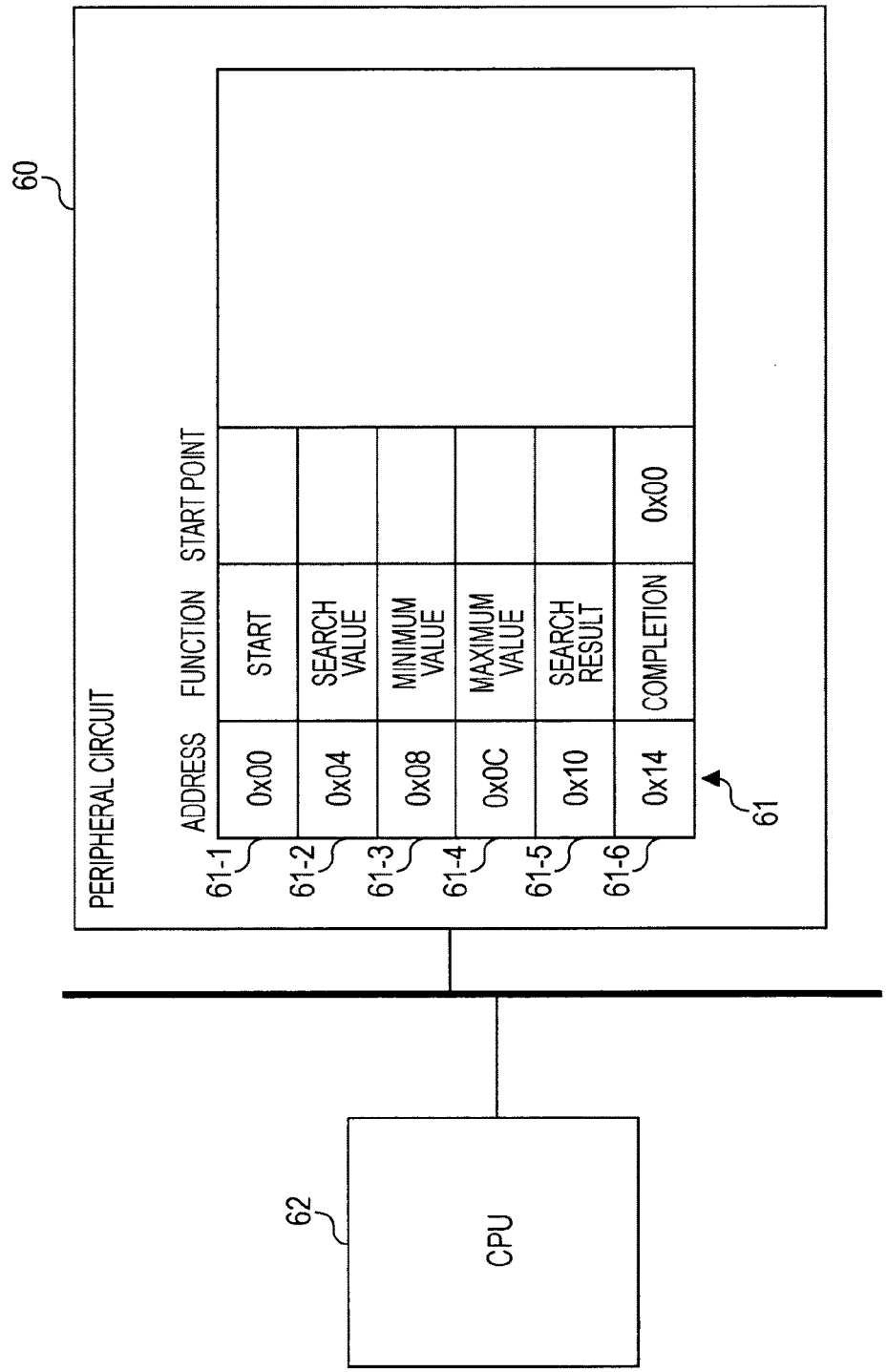
FIG. 11 illustrates an exemplary binary search process.

Thus, when a write into the register 61-1 of the interface register 61 in the peripheral circuit 60 may be executed in a certain transaction, the binary search process may be executed and the value indicating the completion of the process is loaded in the register 61-6. When the simulation in the RTL description measure a delay time, the delay time of the process from a start point to an end point thereof can be measured because, as shown in FIG. 11, the start point of the process is loaded in the register 61-1 having the address of 0x00 and the end point of the process is loaded in the register 61-6 having the address of 0x14.

The measured delay time may be assigned to an input-side register. The delay time of the binary search process may be assigned to the register 61-1 of the interface register 61. Even with the same binary search process, the time required to complete the process varies depending on a search target value. The process execution time differs depending on an input search value. This means that different delay times are measured. In such a case, a maximum delay time may be assigned, as the processing time required for the binary search process, to the register 61-1 of the interface register 61.

Figure 12:
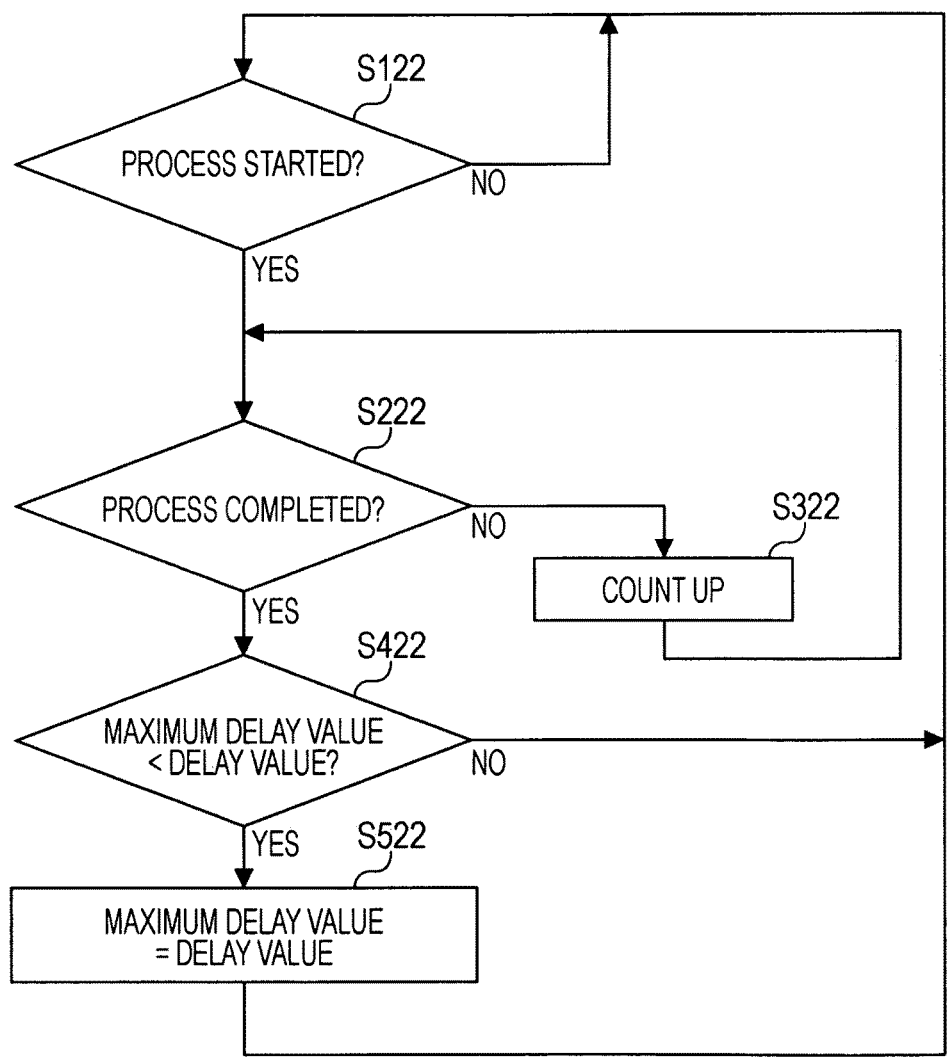
FIG. 12 illustrates an exemplary process for extracting a maximum delay time.

FIG. 12 illustrates a process of extracting the maximum delay time. FIG. 12 illustrates the operation of a control program for controlling the simulation of verifying the performance of a single peripheral circuit alone in the operation S2 of FIG. 8, for example, and for recording the delay time.

In an operation S122, it is determined whether the process is started. In the binary search, it is determined whether the binary search process has been started in response to a write into the register 61-1. If the process is started, it is determined in an operation S222 whether the process has been completed. In the binary search, it is determined whether the value indicating the completion of the process has been written into the register 61-6 in response to the completion of the binary search process.

If the process is not yet completed, a count value is counted up in an operation S322. The count value is obtained by counting, in the simulation of the circuit operation based on the RTL description, the number of cycles of clocks with which the circuit is operated in sync. The count value at the time when it is determined in the operation S222 that the process has been completed provides the delay time (count value). The count value is initialized to zero at the start of the process.

In an operation S422, it is determined whether the measured delay time (count value) is larger than a maximum delay time. If the measured delay time (count value) is larger than the maximum delay time, the measured delay time is set as the maximum delay time in operation S5. The maximum delay time is updated by the measured delay time.

By repeating the above-described process, the maximum delay time may be detected even when the time required to complete the process varies. The detected maximum delay time may be provided as processing time information.

Figure 13:
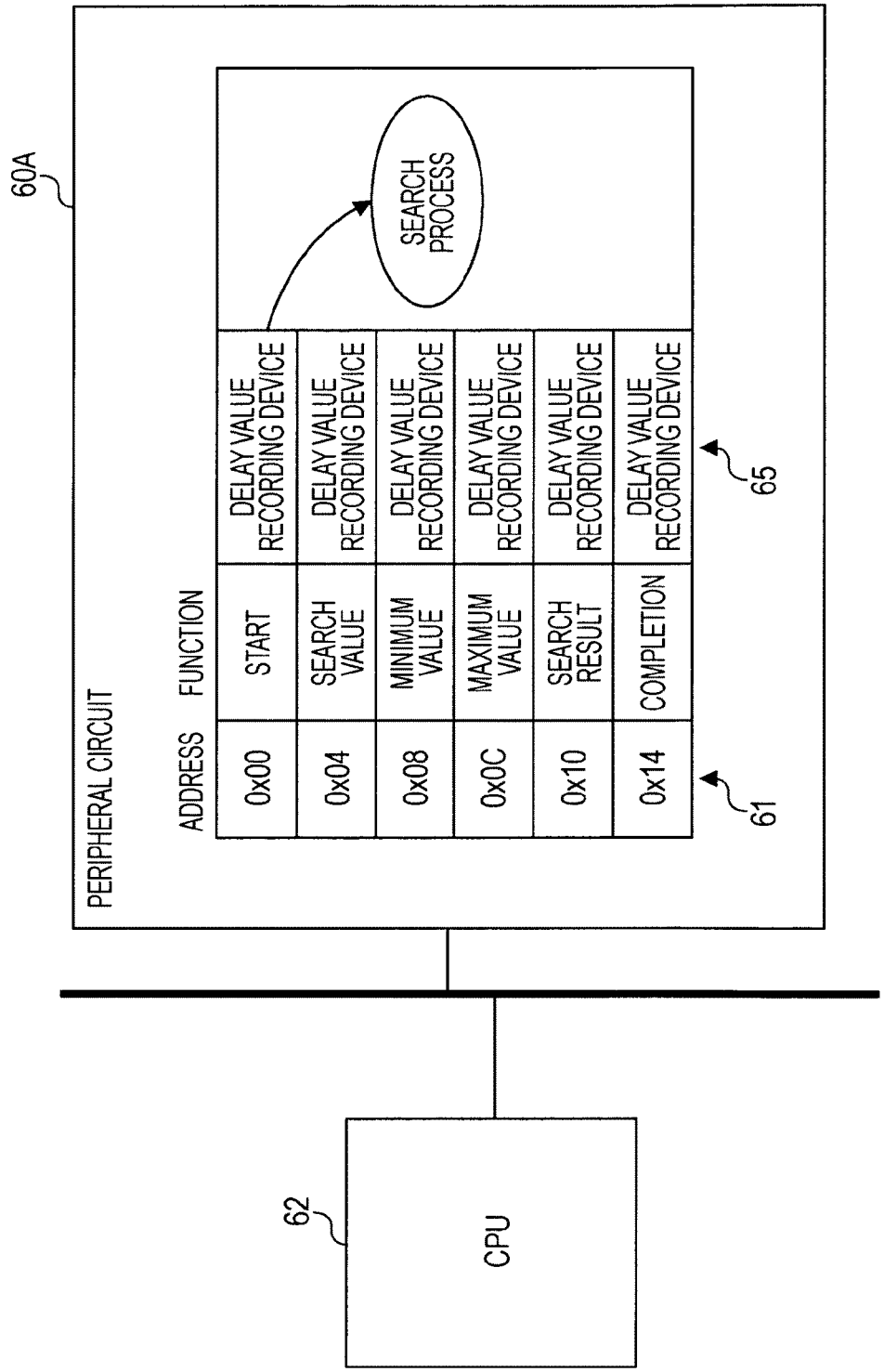
FIG. 13 illustrates an example of delay time recording.

FIG. 13 illustrates delay time recording. In a peripheral circuit 60A shown in FIG. 13, a delay time recording function is added to the functions of the peripheral circuit 60 shown in FIG. 10. As shown in FIG. 13, a delay value recording device 65 is assigned to each register of the interface register 61. When processing corresponding to each register may be executed, a delay time of the processing is recorded by the delay value recording device 65. A recording process may be performed by detecting a maximum delay value and recording it as described in FIG. 12.

Figure 14:
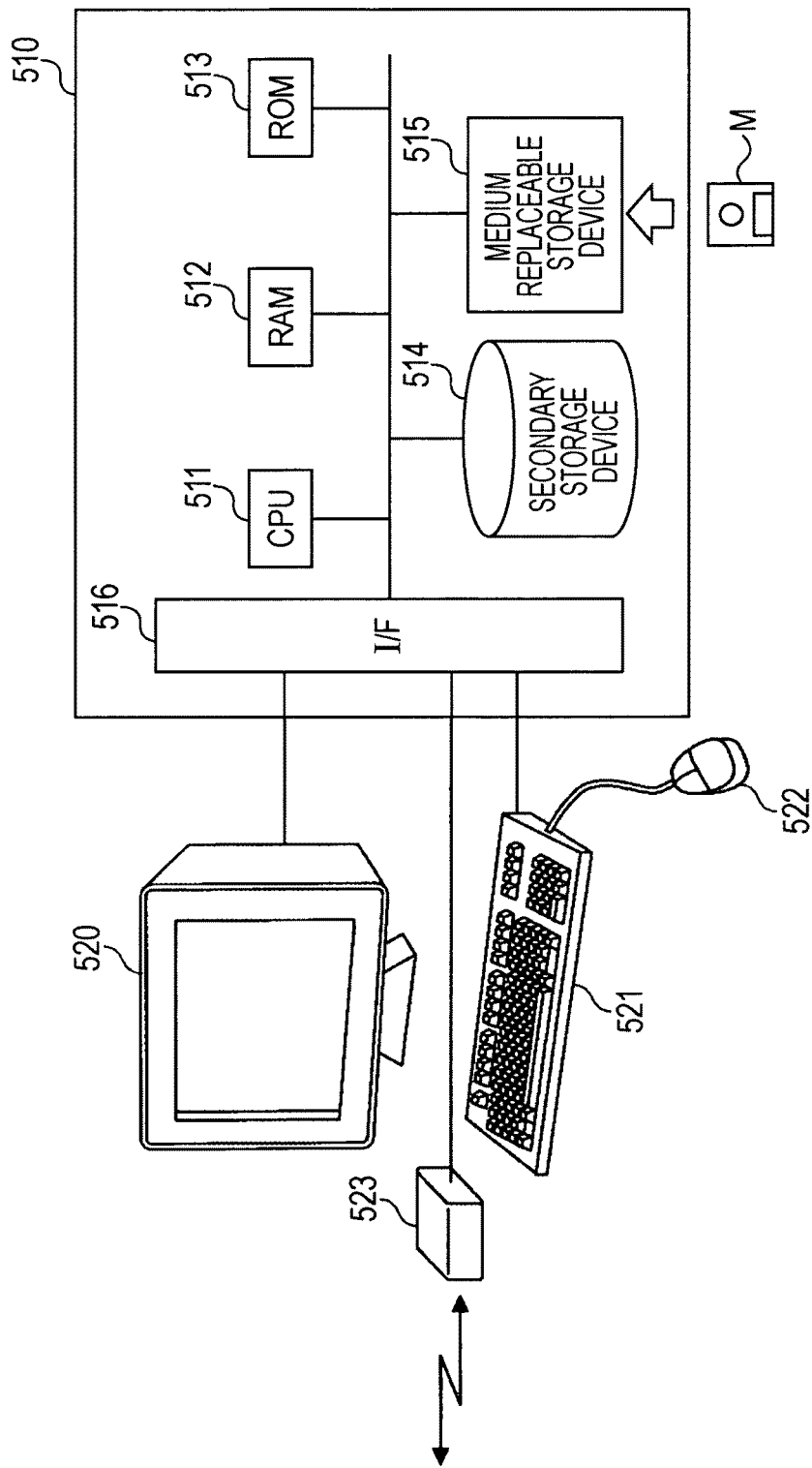
FIG. 14 illustrates another (second) exemplary embodiment.

FIG. 14 illustrates another (second) exemplary embodiment.

A system shown in FIG. 14 executes a performance evaluation model producing method and a system performance evaluation method. The system shown in FIG. 14 includes a computer, such as a personal computer or an engineering workstation. The system shown in FIG. 14 includes a computer 510, a display device 520 coupled to the computer 510, a communication device 523, and an input device. The input device includes, for example, a keyboard 521 and a mouse 522. The computer 510 includes a CPU 511, a RAM 512, a ROM 513, a secondary storage device 514 such as a hard disk, a medium replaceable storage device 515, and an interface 516.

The keyboard 521 and the mouse 522 provide a user interface. The keyboard 521 and the mouse 522 are used to input various commands for operating the computer 510, user demands for data, and so on. The display device 520 displays not only the results of processing executed by the computer 510, but also various data allowing the user to dialog with the computer 510 when the computer 510 is operated. The communication device 523 performs communication with a remote place and includes, for example, a modem, a network interface, etc.

The performance evaluation model producing method and the system performance evaluation method are provided as a computer program executable by the computer 510. The computer program is stored in a storage medium M that can be inserted into the medium replaceable storage device 515, and it is loaded from the storage medium M into the RAM 512 or the secondary storage device 514 through the medium replaceable storage device 515. As an alternative, the computer program is stored in a storage medium (not shown) that is located at a remote place, and is loaded from the storage medium into the RAM 512 or the secondary storage device 514 through the communication device 523 and the interface 516.

When an instruction for starting to execute the program is input from the user through the keyboard 521 and/or the mouse 522, the CPU 511 loads the program into the RAM 12 from the storage medium M, the storage medium located at the remote place, or the secondary storage device 514. The CPU 511 executes the program loaded into the RAM 512 while using an empty storage space of the RAM 512 as a work area, and advances processing through dialog with the user as required. The ROM 513 stores a control program for controlling the basic operation of the computer 510.

By executing the computer program, the computer 510 executes the performance evaluation model producing method and the system performance evaluation method.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A method for generating performance evaluation model comprising:
   executing, by using first models of function modules which are described in a transaction level, a first simulation of system operation at the transaction level between the function modules;
   recording transactions, which are generated in the first simulation per function module, by writing first data in a first portion of an interface register;
   reading second data, which corresponds to a result obtained by performing a first function on the first data and was written in a second portion of the interface register, from the second portion;
   executing, by using second models of the function modules which are described in a hardware level, a second simulation of circuit operation of each of the function modules to determine a delay time from the writing of the first data in the first portion to the reading of the second data from the second portion; and
   assigning information of the delay time to the first model using a second function obtained by inserting information of the delay time to the first function and generating a third model per function module.

2. The method according to claim 1, wherein the first model is described based on PV (Programmer's View), which performs design and verification in units of execution command of application software.

3. The method according to claim 1, wherein the first model assigns, to the function module, an interface register and a function representing the operation of the function module.

4. The method according to claim 1, wherein the second model is described based on RTL.

5. The method according to claim 1, wherein the transaction is recorded in an interface register of the function module, and the delay time is assigned to the interface register.

6. The method according to claim 1, wherein the transaction is at least one selected from a group of consisting of a data write operation and a data read operation.

7. A method for evaluating system performance, comprising:
   executing, by using first models of function modules which are described in a transaction level, a first simulation of system operation at the transaction level between the function modules;
   recording transactions, which are generated in the first simulation per function module, by writing first data in a first portion of an interface register;
   reading second data, which corresponds to a result obtained by performing a first function on the first data and was written in a second portion of the interface register, from the second portion;
   executing, by using second models of the function modules which are described in a hardware level, a second simulation of circuit operation of each of the function modules to determine a delay time from the writing of the first data in the first portion to the reading of the second data from the second portion;
   assigning information of the delay time to the first model using a second function obtained by inserting information of the delay time to the first function and generating a third model per function module; and executing, by using the third models, a third simulation of the system operation at the transaction level between the function modules to determine a processing time of the system operation.

8. The method according to claim 7, wherein the first model is described based on PV (Programmer's View), which performs design and verification in units of execution command of application software.

9. The method according to claim 7, wherein the first model assigns, to the function module, an interface register and a function representing the operation of the function module.

10. The method according to claim 7, wherein the second model is described based on RTL.

11. The method according to claim 7, wherein the transaction is recorded in an interface register of the function module, and the delay time is assigned to the interface register.

12. The method according to claim 7, wherein the transaction is at least one selected from a group of consisting of a data write operation and a data read operation.

13. A system for generating a performance evaluation model and including an arithmetic processing unit which executes a program stored in a memory by a CPU and simulates function modules stored in the memory, wherein the arithmetic processing unit executes, by using first models of function modules which are described in a transaction level, a first simulation of system operation at the transaction level between the function modules;
  records transactions which are generated in the first simulation per function module, by writing first data in a first portion of an interface register;
  reads second data, which corresponds to a result obtained by performing a first function on the first data and was written in a second portion of the interface register, from the second portion;
  executes, by using second models of the function modules which are described in a hardware level, a second simulation of circuit operation of each of the function modules to determine a delay time from the writing of the first data in the first portion to the reading of the second data from the second portion; and
  assigns information of the delay time to the first model using a second function obtained by inserting information of the delay time to the first function and generates a third model per function module.

14. The system according to claim 13, wherein the transaction recorded in the memory is expressed by recording write data and read data with respect to operation cycles.

15. The system according to claim 13, wherein the first model is described based on PV (Programmer's View), which performs design and verification in units of execution command of application software.

16. The system according to claim 13, wherein the first model assigns, to the function module, an interface register and a function representing the operation of the function module.

17. The system according to claim 13, wherein the second model is described based on RTL.

18. The system according to claim 13,
  wherein the arithmetic processing unit assigns an interface register to the function module,
  wherein the transaction is recorded in the interface register of the function module, and
  wherein the delay time is assigned to the interface register.

19. The system according to claim 13, wherein the arithmetic processing unit executes, by using the third models, a third simulation of the system operation at the transaction level between the function modules to determine a processing time of the system operation.

20. The method according to claim 1, further comprising:
  selecting, when acquiring a plurality of delay times, the longest delay time from among the plurality of delay times; and
  inserting information of the longest delay time to the second function.

\* \* \* \* \*